(12) United States Patent
Safarpour et al.

(10) Patent No.: US 8,751,984 B2
(45) Date of Patent: Jun. 10, 2014

(54) METHOD, SYSTEM AND COMPUTER PROGRAM FOR HARDWARE DESIGN DEBUGGING

(76) Inventors: Sean Safarpour, Toronto (CA); Andreas Veneris, Toronto (CA)

( * ) Notice: Subject to any disclaimer, the term of this patent is extended or adjusted under 35 U.S.C. 154(b) by 1359 days.

(21) Appl. No.: 11/938,012

(22) Filed: Nov. 9, 2007

(65) Prior Publication Data
US 2009/0125766 A1    May 14, 2009

(51) Int. Cl.
*G06F 17/50* (2006.01)
*G06F 9/455* (2006.01)

(52) U.S. Cl.
USPC ................ 716/106; 716/51; 716/52; 716/111

(58) Field of Classification Search
USPC ..................... 716/51, 52, 106, 111
See application file for complete search history.

(56) References Cited

U.S. PATENT DOCUMENTS

2008/0127009 A1*  5/2008  Veneris et al. ............... 716/4
2009/0083600 A1*  3/2009  Rahman et al. ............. 714/741

* cited by examiner

*Primary Examiner* — Suresh Memula
(74) *Attorney, Agent, or Firm* — Eugene Gierczak

(57) ABSTRACT

A plurality of diagnosis methods are provided for enabling hardware debugging. A first diagnosis method enables hardware debugging by means of time abstraction. A second diagnosis method enables hardware debugging by means of abstraction and refinement. A third diagnosis method enables hardware debugging by means of QBF-formulation for replicated functions. A fourth diagnosis method enables hardware debugging by means of a max-sat debugging formulation. A system and computer program for implementing the diagnosis methods is also provide.

4 Claims, 5 Drawing Sheets

METHOD, SYSTEM AND COMPUTER PROGRAM FOR HARDWARE DESIGN DEBUGGING

FIELD OF THE INVENTION

The present invention relates to the field of hardware debugging. The present invention more particularly relates to debugging hardware designs implemented in Hardware Description Language (HDL).

BACKGROUND OF THE INVENTION

Hardware design debugging is the process of finding or locating errors in designs after verification methodologies and techniques determine the presence of such errors. Design debugging is considered a major bottleneck in the overall hardware design cycle which consumes over 30% of the design effort. Today, design debugging is performed almost exclusively manually by hardware designers and verification engineers using graphical navigation tools. This is a tedious, time consuming and costly manual process.

A typical hardware design cycle starts with a specification document which describes the functionality, timing and general constraints of the design. The specification is used to both create the design, typically implemented in Hardware Description Language (HDL), and to determine the expected behaviour specified by the verification environment. HDL designs are most commonly implemented at the Register Transfer Level (RTL) using Verilog™ or VHDL. This approach to hardware design typically uses hierarchical and modular design concepts, where blocks or sub-designs are instantiated inside one another and connected together. Hierarchical and modular development is favoured as it is ideal for design reuse, development in a large group, and for verification and debugging among others.

A typical verification environment is composed of a web of advanced tools, methodologies and techniques. Each verification component has a set of strengths and weaknesses which make it ideal of specific verification tasks. Popular verification approaches include the use of one or more of the following:

Simulation engines driven by testbenches (hand written or automatically generated). Known as the work horse of verification, simulation engines are used extensively to quickly test a wide range of input stimuli and find errors quickly. In practice, simulation engines can rarely be used to prove the correctness of a design.

Formal verification tools. Used to formally verify specific properties, corner cases, or equivalences with other designs or models. Due to their slow performance compared to simulation engines, they are employed to prove conformity of important properties.

Semi-formal tools. These use a combination of simulation and formal techniques to verify properties, corner cases and increase verification coverage. They balance the strengths and weaknesses of both approaches.

Each of the above approaches compares the design against a model derived from the specifications to determine whether the design demonstrates a correct or erroneous behaviour.

If the verification methodologies and techniques determine that an error exists in the design (i.e. verification fails), then the design is debugged to find the exact error source. Debugging is a manual task where the verification engineer typically uses the erroneous response of the design, the expected behaviour as stated by the specifications, and the input stimuli to determine what modules, gates, HDL statements or signals are responsible for the erroneous behaviour. The manual debugging process typically starts by examining the erroneous primary outputs and tracing all suspect gates, signals, and modules backwards through the design. Graphical navigation tools can be used to ease the manual tracing process. Suspect components are those whose values appear to be inconsistent with those of the specifications. Needless to say, debugging is usually an ad-hoc hoc process where the verification engineers' knowledge of the design and debugging experience play a major role in the efficiency of the process.

Once a suspect error source is found, the verification engineer attempts to correct the error and reruns the verification step to ensure that the problem has been rectified. In practice, finding the actual error source and correcting the problem is done in a trial-and-error manner where many iterations may be needed until the error is removed. FIG. 1 illustrates a verification and debugging process starting from a design specification.

One particular debugging approach was disclosed in U.S. Pat. No. 6,366,874 to Lee et al., which teaches a system and method for browsing graphically an electronic design based on a hardware description language specification. According to the technique, a user interacts with the system to browse or navigate through the design to find the error locations manually. However, the approach is not automated, requiring the constant input of a user. As well, the solution is tied to a particular graphical representation of the problem.

Other diagnosis methods have been proposed. For example, path tracing is a diagnosis technique that can be used find an error source in a gatelevel representation of a design given a set of input/output vectors that demonstrate the erroneous behaviour [1]. This technique traverses the gatelevel circuit backwards starting at the primary inputs and identifies a set of gates that may be responsible for the erroneous behaviour.

Symbolic simulation (or BDDs) can be used as a means to diagnose erroneous gatelevel designs [2]. The circuit and vectors are used to build a BDD which can be solved to find the gates responsible for the erroneous behavior.

Furthermore, SAT-based debugging solves the diagnosis problem by building a constrained satisfiability problem and uses a SAT solver to find solutions to the problem [3]. The inputs to the problem are a gatelevel circuit and a set of vectors used to detect the error. The output is a set of gates that may be responsible for the erroneous behaviour.

These are example of diagnosis methods and tools that work on the gate/logic level but do not extract capture information from the HDL level and do not translate the results back to HDL. These approaches are different from a hierarchical approach because they only work on the gatelevel (or logic level) and do not consider modular or hierarchical information. In addition, these known techniques do not implement a Quantified Boolean Formula (QBF) approach.

An automatic debugging approach was disclosed in U.S. patent application Ser. No. 11/556,466 to Veneris et al., which teaches a method, system and computer program for automated debugging for pre-fabricated digital synchronous hardware designs implemented in HDL. Required information is captured by interacting with the verification environment after verification fails. This capture information is used to build a diagnosis problem where the solution is a set of logic level error sources. Using the HDL information, the error at the logic level is translated to gates, modules, statements, and signals in the HDL description. The diagnosis problem can be solved efficiently formulating a Quantified Boolean Formula (QBF) problem and also by using the hierarchical and modular nature of the HDL design during diagnosis.

The Veneris application introduces various techniques for debugging. The present invention presents new techniques for debugging. Although most of these techniques are developed for automated debuggers, some may be used for manual debugging also.

BRIEF DESCRIPTION OF THE DRAWINGS

A detailed description of the preferred embodiments is provided herein below by way of example only and with reference to the following drawings, in which.

Figure 1:
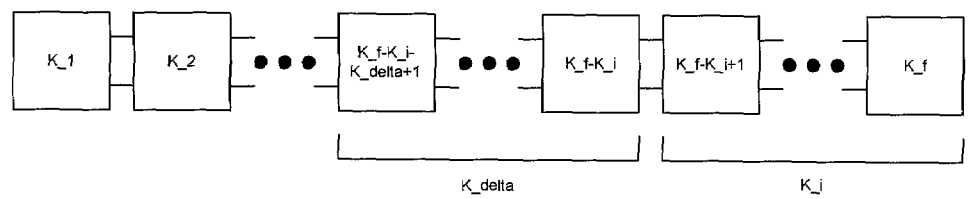
FIG. 1 illustrates debugging using the time abstraction technique.

In the drawings, one embodiment of the invention is illustrated by way of example. It is to be expressly understood that the description and drawings are only for the purpose of illustration

SUMMARY OF THE INVENTION

The present invention provides a method, system and computer program for automated hardware design debugging.

In a first aspect of the present invention, a diagnosis method for the debugging of pre-fabricated and post-fabricated digital hardware designs is provided comprising the steps of: (a) gathering an initial error trace t_e with a predetermined number of clock cycles K_f; (b) copying the signal and value pairs from the initial error trace t_e into a new error trace t_e_i for a predetermined number of clock cycles K_f–K_i+1 to K_f wherein the length K_i is an initial trace bound and the length t_e_i is K_i<K_f; (c) performing debugging using the new error trace t_e_i thereby generating a set of debugging results; (d) analyzing the debugging results to determine if the suspect locations returned are the actual errors; and (e) analyzing the debugging results to determine if they denote one or more error locations.

In a further aspect of the invention, if the debugging results are determined to denote one or more error locations, error trace t_e_i is incremented by K_delta wherein the method continues as long as K_i<K_f.

In another aspect of the invention, a diagnosis method for the debugging of pre-fabricated and post-fabricated hardware designs is provided, the method comprising the steps of: (a) converting the hardware design into design conjunctive normal form; (b) adding the stimulus and expected response constraints to the design conjunctive normal form; (c) generating a map between components in the hardware design and the conjunctive normal form; (d) determining a maximal subset of clauses that result in a satisfiable problem; (e) inverting the maximal subset of clauses to determine a subset of clauses that result in an unsatisfiable problem; and (f) using the generated map to relate the inverse set of clauses to the actual components in the hardware design.

In yet another aspect of the invention, a diagnosis method for the debugging of pre-fabricated and post-fabricated hardware designs is provided the method comprising the steps of: (a) selecting a first plurality of design elements; (b) removing the first plurality of design elements in the overall design; (c) optionally removing a second plurality of design elements in the overall design that provide a direct or indirect driving signal to the first plurality of design elements; (d) inserting a plurality of signals in place of each of the said design elements in the overall design; (e) performing debugging on the modified overall design with the inserted signals constrained to their simulation value; (f) analyzing the results of debugging and determining error locations; and (g) optionally reintroducing said removed design elements if the inserted signals are returned by the debugging.

In a still other aspect of the invention, a diagnosis method for the debugging of pre-fabricated and post-fabricated hardware designs is provided comprising the steps of: (a) selecting a plurality of design elements, each said design element operable to perform the same function as the remaining of the plurality of design elements; (b) instantiating a single copy of said plurality of design elements; (c) providing a plurality of multiplexers comprising a number of inputs equal to the number of design elements comprising the plurality of design elements; (d) connecting an output of each multiplexer to an input of the single copy; (e) providing a demultiplexer comprising a number of outputs equal to the number of design elements comprising the plurality of design elements; (f) connecting an input of the multiplexer to an output of the single copy; (g) connecting a select signal to the multiplexers and demultiplexer; (h) converting a resulting problem into a QBF problem where the select signals are universally quantified; and (i) performing debugging on the QBF problem to find the error locations.

DETAILED DESCRIPTION OF THE INVENTION

The present invention provides an automated or manual hardware design debugging approach implemented as a method, system and computer program.

Generally speaking, the overall process of finding the source of errors in a design at the HDL level is referred to as "debugging" and the process of locating the error sources at the gatelevel and logic level is referred to as "diagnosis". The techniques outlined herein apply to both debugging and diagnosis and thus the two terms are used interchangeably.

This automated debugging approach is different from the existing manual debugging processes described above because limited user interaction is required which makes the present invention substantially automated. This invention, in one aspect thereof, is a debugging engine which uses constraint satisfaction to solve the debugging problem.

Constructing a Diagnosis Problem

Once Capture Information is extracted from the user's environment, there is generally enough information to use known diagnosis techniques to solve the debugging problem. Diagnosis techniques use a set of input vectors, output vectors and a design at the logic or gatelevel to try to identify the inconsistencies between the output of the design and the output vectors. Some popular techniques use simulation and path tracing methods, Binary Decision Diagram (BDDs), or reformulate the problem as a constraint satisfaction problem or otherwise including as provided for example in U.S. patent Ser. No. 11/555,466.

Constraint satisfaction is one method of solving the diagnosis problem where the aim is to find a satisfying assignment to the former which leads to a solution to the latter. Generally speaking, constraint satisfaction problems can be solved using many different known approaches. Some popular techniques are list below.

Boolean Satisfiability (SAT) solver. These solvers, use branching and resolution techniques to find a satisfiable assignment to the problem variables (see for example [4]).

Binary Decision Diagrams (BDD). These data structures formulate the problem in canonical manner and find a satisfying assignment by traversing the BDD graph (see for example [5]).

Quantified Boolean Formula (QBF) solvers. These solvers are similar to SAT solvers except that they can solve more general satisfaction problems where some variables are universally quantified in the problem (see for example [6]).

Automatic Test Pattern Generation (ATPG) and branch-and-bound search techniques. These approaches search the problem space according to the problem structure and heuristics to find a satisfying assignment (see for example [7]).

Figure 4:
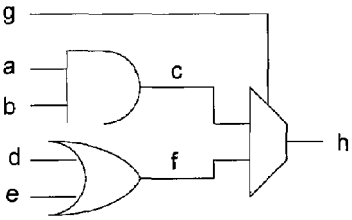
FIG. 4 illustrates debugging using the max-sat debugging formulation.
Figure 5:
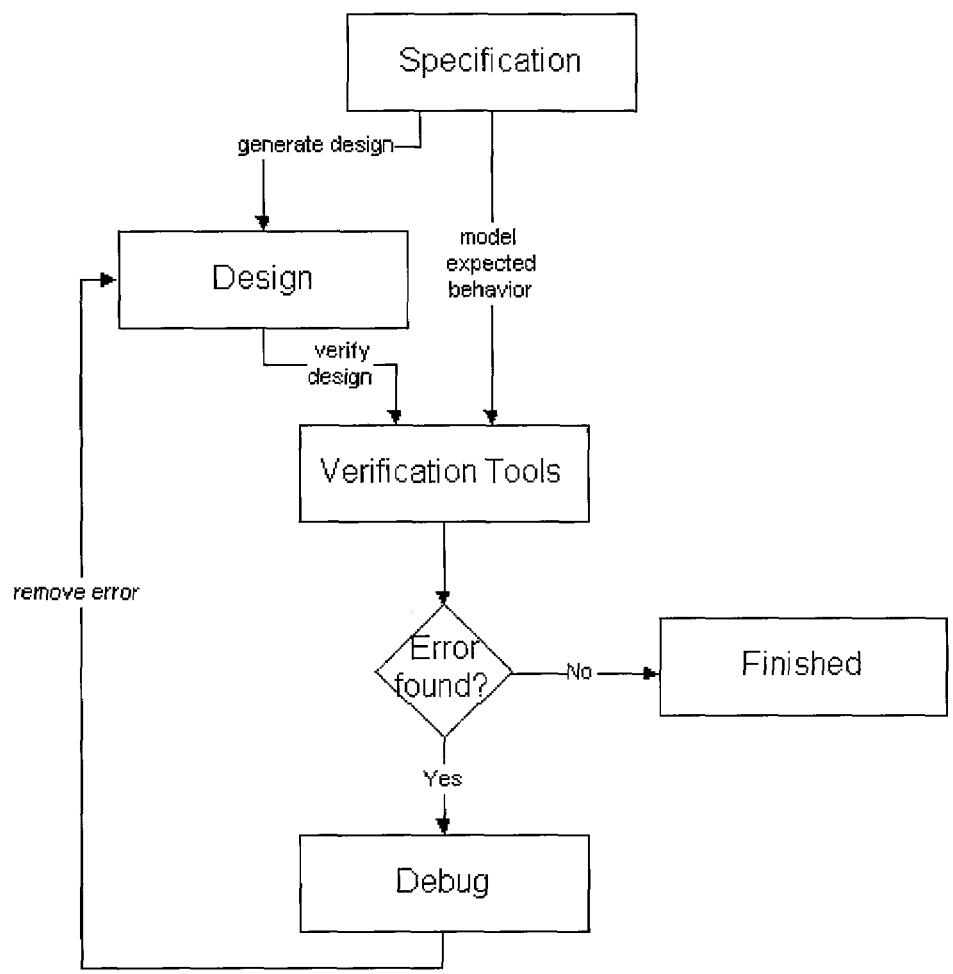
FIG. 5 illustrates an overview of a verification and debugging process.

The constraint satisfaction problem is generally formulated mathematically according to the following steps (hereinafter the "constraint satisfaction steps"):

1. Translating the erroneous digital synchronous circuit from its HDL representation (either at the RTL or gatelevel) into a mathematical model. This step can be performed by existing HDL synthesis tools which iteratively break HDL statements into series of gates or logic that implement the required functionality. For the SAT and QBF approaches, this model is further converted to Conjunctive Normal Form (CNF). For BDD approaches, the gate representation is converted to BDDs while ATPG and other search methods work on a logical or graph-based model.
   a) These mathematical models only represent the combinational component of the circuits. The sequential components (i.e. flip-flops, latches, etc.) are removed and their input and outputs are replaced with current state and next variables, respectively. This process is often called converting a circuit into its "full-scan" representation.
2. Inserting error models into the mathematical circuit model to represent the error locations.
   a) These models ($s_1, s_2 \ldots, s_n$) can be added to every variable (or circuit line depending on the circuit model used) or a subset of the variables. From the circuit point of view, these can be multiplexers (MUX), where the 0-input of the MUX is connected to the original variable and the 1-input of the MUX is connected to the a new primary input (unconstrained variable). The output of the MUX is connected to the fanouts of the original variable and the select lines are left unconstrained ($s_1, s_2 \ldots, s_n$). FIG. 4 gives an example of how the MUX error models are added to a gatelevel circuit representation.
   b) The MUX error model can be formulated as logic or in CNF. A CNF representation of the model for the original variable l, the fanout variable w, and a multiplexer select line s is (where l' and w' are the inverted variables l and w, respectively):

(l+s+w')·(l'+s+w).

c) Other representations having the same behavior as a) and b) exist for this error model.
   d) Error models may be added to a subset of the variables. For example, in hierarchical or modular debugging techniques, the error models are only added to the output of modules at each stage of the design hierarchy. Adding error models on a subset of the variables can increase the debugger efficiency and overall effectiveness.
3. The constraint satisfaction problem is constrained to only allow N error sources to be active at one time. This allows the diagnosis framework to be run iteratively with N=1, 2, 3 . . . until error sources are found. This constraint is called the Error Cardinality Constraint (ECC) and can be implemented using many different techniques such as adder-comparator circuits, or sorter circuits. For instance, the adder-comparator circuit takes as input the error model variables ($s_1, s_2 \ldots, s_n$) adds these together to get an integer N' which is forced to be equal to N. The ECC block can be converted to CNF using existing techniques [8].
4. For each of the k clock cycles in the debuggerClk signal the model in step 2 is replicated or unfolded into k time frames. Each time frame is modified such that its current state variables are connected to the next state variables of the previous time frame. This construction is also known as the Iterative Logic Array (ILA).
5. The input stimulus values stored in debuggerInputs and the expected output values stored in debuggerOutputs are applied to the corresponding variables and time frames in the iterative logic array model of step 2. For the SAT and QBF approaches, these values are applied using unit literal clauses. In the BDD approach, edges in the graph corresponding to the opposite values are removed thus simplifying the graph. In the ATPG and other search methods, constant constraints are added to the problems. Similarly, the initial state values stored in debuggerstate are applied to the current state variables of the first time frame only.
6. The overall constraint problem of step 5 can be solved using many different approaches such as SAT and QBF solvers and BDDs. FIG. 5 represents the entire constraint satisfaction for k clock cycles.
7. To guarantee that the error sources are found by the diagnosis tool, all the possible solutions to the constraint satisfaction problem are found. This is accomplished by iteratively running step 6 and searching for different solutions until no more solutions exist. For example, in the SAT approach this task can be accomplished by adding a clauses or constraint to the problem after a solution is found to prevent the solution from be found again.

3. Translating Results to the HDL-Level

The result of the diagnosis approaches described above is a set of potential error sources at the logic or gate level that may explain the inconsistencies between the HDL design and the specifications. This information, albeit valuable, may not provide much insight to the designer. If the results are most useful at the HDL or higher level, for maximum effectiveness, the error sources are translated to the design entry level that the designer is familiar with. In other words the logic level error sources are translated to the HDL level.

A logic to HDL (Logic-HDL) map is created in step 1 of the constraint satisfaction method steps. In this step, every HDL statement is systematically broken into the logic functions that it implements. This process is known as HDL synthesis. During HDL synthesis, every variable at the logic level is added to a hash-like data structure that relates it to its source (s) at the HDL. Sources at the HDL level are statements that specify the function of a given variable. Further information such as the module's parent or encapsulating modules (children), the file name, and the line number of the HDL statement are also stored in the data structures.

When diagnosis tools, such as those described above, return logic level error sources, these logic level variables are translated to their corresponding statements at the HDL level using the Logic-HDL map. The final result of this step is a set of HDL statements, modules, files, and line numbers that are potential sources of errors.

This information may be simply presented as above or displayed in a graphical manner. For example, a hierarchical tree structure where potential erroneous modules and gates are highlighted with different color may provide more insight. Similarly, the potential erroneous HDL statements can be highlighted for quick identification.

Improving Diagnosis

Figure 2:
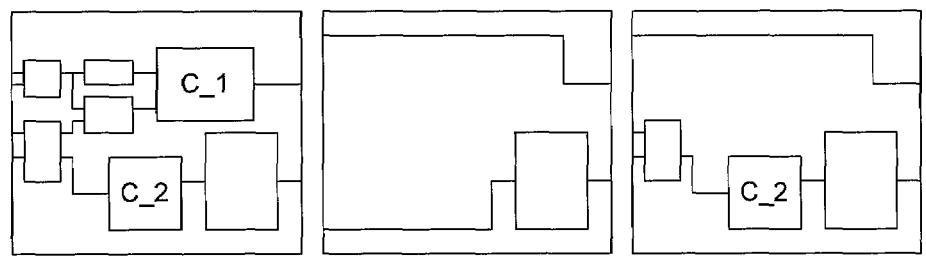
FIG. 2 illustrates debugging using the abstraction and refinement technique.
Figure 3:
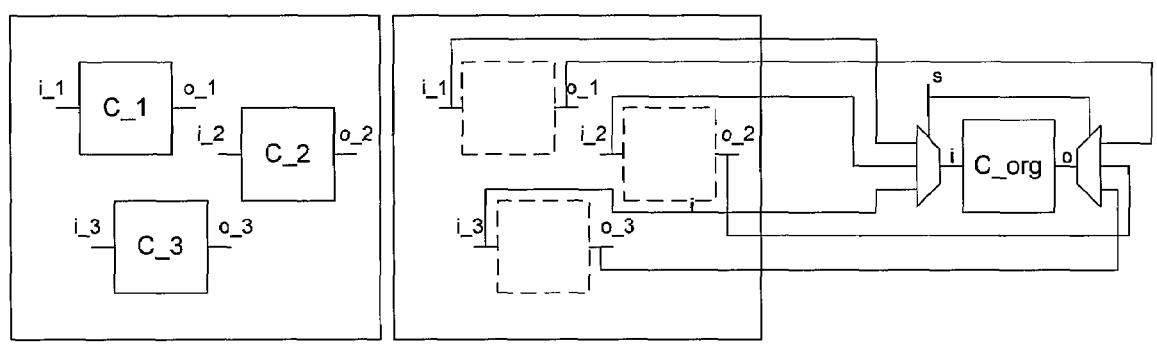
FIG. 3 illustrates debugging using the quantified Boolean formula technique.

Specific steps described above can be modified to achieve better performance results for overall debugging. The present invention provides for four techniques to achieve the desired goal of overall debugging as follows:
1) Time Abstraction, as illustrated in FIG. 1.
2) Abstraction and Refinement, as illustrated in FIG. 2.
3) QBF-Formulation for Replicated Functions, as illustrated in FIG. 3.
4) max-sat Debugging Formulation, as illustrated in FIG. 4.

FIG. 5 illustrates an overview of a verification and debugging process which may be used in conjunction with the described diagnosis methods. The system and computer program of the present invention is best understood as a system or computer program generally consistent with the system and computer program described in U.S. patent application Ser. No. 11/556,466, but implemented so as to enable the diagnosis methods described herein.

It should be noted that these debugging techniques are not mutually exclusive and may be run sequentially or in parallel.

Time Abstraction

In one aspect of the present invention, a debugging technique is provided entitled "Time Abstraction". From a high level perspective, Time Abstraction is similar to the "Bounded Model Checking" technique [10]. However, the goal of Bounded Model Checking is to find the presence of errors or bugs in a design within a given bound. In stark contrast, the goal of the present invention Time Abstraction is to find the source of an error or bug within a given bound.

The Time Abstraction debugging technique involves the use of a simulation trace or error trace. These traces refer to a sequence of signal and value pair that when applied to the inputs, memory elements or other signals of a design, an error or a discrepancy is observed between the design's actual behaviour and its intent. This discrepancy is caused by errors or bugs in the design, testbench or specifications. The simulation trace is also referred to as an input vector. In some situations it may be appropriate to include signal and value pairs for the response or intent of the design in the error trace. Common verification techniques such as simulation-based techniques (simulating a design with the use of a testbench or an automatically generated testbench) and formal/semi-formal tools (equivalence checkers and property checkers) produce error traces when an error is observed. One key characteristic of an error trace is its length in terms of the number of clock cycles or the number of transactions it includes. The longer an error trace, the more signal value pairs it contains.

During a manual debugging process, a verification engineer analyzes the signal values in the error trace in order to find the source of error. Similarly an automated debugging tool such as the one described in U.S. patent application Ser. No. 11/556,466 or [8] [9], manual debugging requires the entire error trace in order to perform debugging. The entire trace allows all potential sources of errors to be considered from the beginning of the trace until the error is observed. It should be noted that the general characteristic of design debugging (both for automated and manual approaches) is that it becomes more difficult to pinpoint the cause of the error if the error trace length is increased. The debugging technique of Time Abstraction of the present invention is a technique that systematically considers subsets of the trace during debugging. Time Abstraction includes performing an analysis that determines whether longer subsets are required for a complete analysis to maximize the possibility of finding the actual error. One of the benefits of the Time Abstraction debugging technique is that large and complex debugging problems can be tackled in an incremental manner. This incremental approach can either result in solving the problem much faster than conventional techniques or it may find some error sources for problems that cannot be solved completely.

The basic algorithm for Time Abstraction is shown below:
Initial: Assume a single error trace $t\_e$ of size $K\_f$ (clock cycles), and assume that the set S representing suspect error locations is empty. Assume an initial trace bound $K\_i$ and trace increment $K\_delta$.
1. Copy the signal and value pairs from $t\_e$ into a new error trace $t\_e\_i$ from clock cycles $K\_f-K\_i+1$ to $K\_f$ Note: the length of $t\_e\_i$ is $K\_i < K\_f$.
2. Perform manual or automated debugging using trace $t\_e\_i$ with $K\_i$ clock cycles assuming that the values of the initial states init_i. The values for init_i are found by simulating the design with $t\_e$ for $K\_i$ clock cycles and capturing the next state values of the registers in clock cycle $K\_i$ (or current states in clock cycle $K\_i+1$). For automated debugging ensure that error locations in set S are prevented from being returned as a solution (this is done by adding blocking solutions).
3. Add every suspect location found by the automated debugger, except for initial state variables, into the set S. Analyze the items in S to determine where it is the actual error location. If the actual location is found by the automated debugger or by manual debugging (manual analysis), the debugging process is finished.
4. If automated debugging identifies the initial states (at the beginning of clock cycle 1) as an error source, then $K\_i=K\_i+K\_delta$ or if $K\_i+K\_delta > K\_f$ then $K\_i=K\_f$.
5. If $K\_i < K\_f$ then go back to step 1 but prevent, else add the initial state variables into S and the debugging process is finished.

The above algorithm identifies possible error suspects in S that may be responsible for the discrepancy between the design behaviour and the design intent. Specifically, it should be noted that the actual error which may be responsible for the aforementioned discrepancy is one of the identified suspects in S.

This algorithm can be combined with other performance improvement techniques such as the QBF formulation as described in U.S. patent application Ser. No. 11/566,466 for multiple sequential traces and hierarchical debugging also illustrated in said patent application.

In addition, as indicated by the algorithm, Time Abstraction can also be used during manual debugging by following the systematic analysis described. The only difference is that instead of using an automated tool to find the suspects, a verification engineer finds the suspects manually. FIG. 1 depicts a debugging problem with $K\_f$ clock cycles, an initial trace bound of $K\_i$, and trace increment of $K\_delta$.

Abstraction and Refinement

In a further aspect of the present invention, a debugging technique is provided entitled "Abstraction and Refinement". Debugging is an increasingly difficult task subject to the size of the design under consideration. To efficiently perform debugging a portion of the design under consideration should be restricted to a manageable size, both for humans and for automated software solutions. Abstraction is used to reduce the size of the design for the purpose of debugging by removing some of its components which may not be required for the debugging task at hand.

The benefit of the Abstraction and Refinement technique is that designs for which debugging is very difficult or even impossible for automated tools can be handled. Such difficulty may be a product of the design size, which may require an unreasonably large simulation time in an automatic debugger. Theoretically, in the worst case, the subset of the design that must be considered is the entire design. However, this case is infrequent in practice as most errors only influence particular sections of a design. Considering the case where debugging is impossible with automated tools, Abstraction and Refinement gives a strict advantage as it returns suspected errors even if the results may not be complete.

The Abstraction and Refinement technique may preferably be used in association with an automated debugger system similar to that described in co-pending U.S. patent application Ser. No. 11/556,466. Optionally, the Abstraction and Refinement technique may be used manually by a verification engineer. The Abstraction and Refinement technique is more particularly described below.

A determination of which components and the number of said components to remove can be made based on analysis and use of heuristics. A simplified version of the design that does not include the removed components can be used for debugging by a verification engineer or an automated debugger system. It should be understood that in this disclosure "component" and "design element" are used interchangeably to refer to an a set of design units that perform a certain functionality. Some examples of design elements are functions, modules, blocks, and units.

When a portion of the removed design is suspected to be a likely error location, the removed component is re-introduced in the design and debugging performed once again.

Abstraction and Refinement can be applied to different representations of a design. A gate-level or Boolean level graph or netlist derived from the synthesized RTL design are some popular representations. Other representations can be block or module graphs derived from the RTL or custom component graphs or netlists.

A typical implementation of the abstraction and refinement technique is now described.

Initially, the set, S, representing suspect error locations is empty. The verification engineer or the automated system may select a set of components to be abstracted. For example, the number of components to abstract may be a percentage of the total design. The components to be abstracted may include state elements (flip-flops), gates, RTL modules, RTL statements, or any grouping of gates. The higher the number of components to abstract the faster the each debugging process will be but more iterations of this algorithm will be necessary. Each type of component such as a state element, gate, RTL module, RTL statement, or gate grouping may be represented by C.

1. The abstraction and refinement technique first analyses each given component $C\_i$ by performing a backwards traversal to collect all other components $C\_j$ that only transitively fan out to $C\_i$. In other words, $C_j\_j$ does not drive any components other than $C\_i$ or components that drive $C\_i$.

2. Optionally, and for an improvement in performance, all $C\_i$ and $C\_j$ components are then removed from the design. The outputs of each $C\_i$ component are replaced with new primary inputs. This stage may be referred to as "abstraction".

3. The values of the new primary inputs are constrained to the output values of the removed components. The output values of the removed components may be determined by simulating the error trace provided for debugging. For sequential designs, these values at each time-frame (clock cycle) is provided and is constrained to the value determined by simulation at the corresponding clock cycle.

4. The simplified and constrained version of the design above is used to perform debugging. For manual debugging, this design is analyzed by hand by the verification engineer. For automated debugging, this design is the input to the automated debugging tool.

5. Each suspect location, except for the added inputs found by the automated debugger or manual debugging process, is added to the set S. The items in S may be analyzed to determine if it is the actual error location. If the actual location is found by the automated debugger or by manual debugging, the debugging process is complete.

6. If debugging identifies any of the added primary inputs as potential error locations, re-introduce the removed components corresponding to the inputs into the design. Ensure that the added primary inputs and its constrained values are removed. This stage may be referred to as "refinement".

7. Steps 4 to 6 may be repeated until no constrained inputs are returned as a suspect location or until the entire design is re-introduced.

The above algorithm finds error suspects in S that can be responsible for the discrepancy between the design behaviour and its intent. The actual error is one of the suspects in S. This algorithm can be combined with other performance improvement techniques such as the QBF formulation of co-pending U.S. patent application Ser. No. 11/556,466 for multiple sequential traces and hierarchical debugging also of co-pending U.S. patent application Ser. No. 11/556,466. As shown in the algorithm, time abstraction can also be used during manual debugging by following the systematic analysis described. The only difference is that instead of using an automated tool to find the suspects, a verification engineer finds the suspects manually.

It should be noted that Abstraction and Refinement techniques are used readily in model checking to mitigate the exponential nature of the underlying state space [10] [11] [12]. Although these techniques are similar in concept and name, they are applied to different problems and in a different context. In model checking the goal is to find the existence of errors/bugs and as such abstraction must enforce that the properties that are verified are still valid in the abstract model and that no error behaviour escapes. In debugging the goal is to find the source of errors or bugs and as such consistency with a given property is not required; however, precautions must be taken in order to find the true error source and not an abstracted one.

QBF Formulation for Replicated Functions

In a further aspect of the present invention, the automated debugging problem can be formulated as a QBF (quantified Boolean formula) problem.

A design representation can contain many modules/components/functions ("functions") that are instantiated or used multiple times throughout the design. This reuse can be either made explicitly by the designer or the designer may be unaware of them. For instance an "adder" circuit block can be instantiated every time an addition is required. Another example is a cluster of AND and MULTIPLEXER gates that are used throughout a design without the user explicitly instantiated such a logic. These components implement the same function at different locations in the design. Again, it should be understood that "component" and "design element" are used interchangeably to refer to an a set of design units that perform a certain functionality. Some examples of design elements are functions, modules, blocks, and units.

The present invention implements a formulation that reduces the multiple function instantiations to a single instantiation. A QBF, a type of constraint satisfaction problem, is formulated such that a single copy of the components is used during analysis of the design. The benefit of this QBF formulation is that the memory requirements are much smaller than the original representation.

This invention works on any gate level or Boolean level representation that can be converted into a Boolean Satisfiability problem or a Quantified Boolean Formula Satisfiability problem. Some applications of this invention are design debugging, model checking, and ATPG.

The QBF formulation is as follows:

Initial: At the component or gate or Boolean level (higher level representations can be converted/synthesized into gate/Boolean level), identify the modules/components/functions (simply called components) desired to be quantified. In other words, the component is selected that is to be made into a single copy. This step can be performed manually or automatically to determine these components. Different techniques and heuristics can be used to identify these components. For each of these components, steps 1-7 below are followed.

For each component type C in the design, instantiate a single copy, C_org, of the selected component.

1. Generate X-to-1 multiplexers and 1-to-X demultiplexers connected to each of the inputs and outputs of C_org, respectively. Let K be the number of instances of the component. Then, X=2^ (ceiling(log_base_2(K)). Note that switches or CNF clauses or other gates that perform the same functionality as multiplexers and demultiplexers can be used.
2. Tie (connect) the select lines, s, of the multiplexer and demultiplexer pair together.
3. Remove every instance (occurrence) of component C in the circuit, leaving its input and output pins or ports in the design.
4. For every component C_i of type C, for every input and output, connect the jth input or output of C_i to the corresponding ith input or output of the multiplexer and demultiplexer of C_org to the jth port or pin, respectively. The net effect is that everywhere there is an instance of C, C_i is removed and there is a connection between its input and output to the pins or ports of C_org.
5. Convert the result of step 4 to the intended representation for automated debugging: SAT, QBF, Boolean Formulas, etc. In this representation universally quantify the select lines s thus resulting in a QBF problem. The ordering of the quantification depends on the original problem intent.
    (a) If the original problem is a SAT problem of the form Error! Objects cannot be created from editing field codes. where v are the problem variables and Error! Objects cannot be created from editing field codes is the Boolean propositional formula, then the new formulation is Error! Objects cannot be created from editing field codes, where s are the select line variables.
    (b) If the original problem is a QBF problem of the form Error! Objects cannot be created from editing field codes. where each Error! Objects cannot be created from editing field codes. and the Error! Objects cannot be created from editing field codes.'s form a strict subset of the problem variables and Error! Objects cannot be created from editing field codes. is the Boolean propositional formula, then the new formulation is Error! Objects cannot be created from editing field codes, where s are the select line variables.
6. The exact location of the universal quantification of s within theError! Objects cannot be created from editing field codes. terms depends on the problem application.
7. The resulting QBF formula can be given to any QBF solver to solve the original problem with only one copy of the C components.

The above formulation is structured in a way that allows the original SAT or QBF problem to be solved independent of its exact structure of context. This technique allows for the use of a single copy of the chosen components thus reducing the memory requirements of the end application. In the context of debugging, this technique can be used in conjunction with the techniques of Time Abstraction and Abstraction and Refinement described herein as well as those described in co-pending U.S. patent application Ser. No. 11/556,466.

Max-Sat Debugging Formulation

In a further aspect of the present invention, the automated debugging problem can be alternatively formulated as a maximum satisfiability (max-sat) problem instead of a standard SAT or QBF problem (a different type of constrain satisfaction problem). Specifically, provided with an unsatisfiable Boolean propositional formula, the max-sat problem consists of finding the largest subset of the formula such that it is satisfiable [13]. For the majority of SAT problems where the input is given in Conjunctive Normal Form (CNF), the max-sat Problem identifies the largest satisfiable subset of clauses. As a corollary, the inverse of this subset, C_inv, represents the smallest subset whose removal from the largest subset of clauses would make the problem satisfiable.

The basic algorithm for max-sat Formulation consists of:
1. generating the unsatisfiable problem instance
2. grouping clauses based on the granularity of debugging (optional) (determined by the user and/or a higher level algorithm)
3. solving the max-sat problem based on maximum groupings
4. relating the solution of max-sat to components in the design Step 1. The max-sat formulation is constructed using the design (or circuit) under debug or diagnosis consideration and the input trace and the expected output values. The design is converted into constraints CNF using techniques such as [14], the input trace and output expected values are added to the CNF by converting each signal/value pair into a unit clause. The mapping between components in the design and the CNF should be stored as it is needed for the fourth step. The resulting formulation is inherently unsatisfiable because a design with an error (or a fault) is not expected to give a correct output for a given set of input sequence. A max-sat solver can find the maximal subset of the problem clauses that can be satisfied. The clauses contained in the inverse of this subset are the clauses responsible for the discrepancy.

Step 2. In order to relate the results of the max-sat solver to the debugging problem, the clauses in C_inv returned must be mapped to the gates or components from which they are derived. One method to achieve this mapping is to group the clauses and use the max-sat technique to identify the maximum groups (instead of individual clauses). This may be achieved by adding a single literal y to every clause groupings such that when y is 1, the entire clause is satisfied (and in effect removed from the problem). Groupings can be based on gates, modules, structurally or topologically, or arbitrarily.

These groupings can significantly increase the performance of a automated debugging engine as it allows smaller subsets of the problem to be handled hierarchically or iteratively. The result of the max-sat problem will be linked directly to these groups. Each group returned may contain the source of error or fault.

For example, FIG. 4 illustrates a grouping of AND, OR and MUX gates such that the AND and OR are grouped in y_1 together and the MUX is in a separate y_2 group. The resulting CNF is also depicted in FIG. 4.

Step 3. Solving the max-sat problem returns the minimum number of clauses, C_inv, whose removal make the problem satisfiable. These clauses represent a potential error/bug/fault location. Since there may be more than one solution to the max-sat problem, the actual bug may or may not be returned as the max-sat solver. As a result most debugging and diagnosis techniques require that all potential locations be found. To find all the max-sat solutions, a found solution is encoded as a "blocking clause" to prevent the solution from being found again, and the max-sat solver is run again. Additionally, when all solutions are sought, a limit is often given in terms of the minimum number of solutions sought by the max-sat solver. This number is also referred to as the error cardinality [8]. When the next biggest solution is found to be less than the minimum limit, the procedure terminates. For example, in one embodiment of the present invention, the minimum limit for the max-sat Solver is 10 clauses, all solutions that satisfy the SAT problem with at least 10 clauses are required max-sat solvers typically start by finding the solutions of size 1, 2, 3 clauses and so on until the limit is reached.

Step 4. From each solution returned to by the max-sat solver, the inverse set of clauses C_inv are then extracted and related to the components they were derived from. This reverse mapping of the CNF clauses to components may be accomplished by using the storage structure of Step2. If Step 2 (optional) is performed, each solution by the max-sat solver is in terms of the grouping variables (i.e. they variables). These may relate them directly to the components.

Max-Sat and Approximations

Due to the clause groupings, the max-sat formulation can also be used as a pre-processing step that can make an over-approximation of the erroneous components. Thus the solutions of one step can be used to filter the grouping of a proceeding step. For example, the design components can be grouped into 4 strict groups where the clauses returned by C_inv contain solutions in terms of these 4 groups. In the next step, groupings of a finer granularity may be made only on the clauses found in the solutions of the previous step. As shown by the above example, the over-approximation may be applied iteratively to find the solutions at the required level of granularity. Similarly to the hierarchical debugging technique of U.S. patent application Ser. No. 11/566,466 the groupings of max-sat can be applied hierarchically and iteratively to solve the problem. A further advantage of utilizing max-sat with the hierarchical approach, is that for each hierarchy level, the problem max-sat problem is smaller thus easier to solve.

It should be noted that the max-sat procedures described in the present invention apply equally to the circuit diagnosis problem as well as design debugging.

REFERENCES

[1] M. Abramovici, P. R. Menon, D. T. Miller, "Critical path tracing—an alternative to fault simulation," in Proc. of Design Automation Conference, 1988, pp. 468-474

[2] S. Huang, "Speeding up the Byzantine fault simulation using symbolic simulation," in Proc. of VLSI Test Symposium, 2002, pp. 193-198

[3] A. Smith, A. Veneris, M. F. Ali, and A. Viglas, "Fault diagnosis and logic debugging using Boolean satisfiability, " IEEE Trans. on CAD, vol. 24, no. 10, pp. 1606-1621, 2005

[4] J. Marques-Silva and K. Sakallah, "GRASP: a new search algorithm for satisfiability," in Int'l Conf. on CAD, 1996, pp. 220-227

[5] R. Bryant, "Graph-based algorithms for Boolean function manipulation," IEEE Trans. on Comp., vol. 35, no. 8, pp. 677-691, 1986

[6] M. Benedetti, "sKizzo: a Suite to Evaluate and Certify QBFs," in Proc. of 20th International Conference on Automated Deduction (CADE05), 2005, pp. 369-376

[7] M. Abramovici, M. Breuer, and A. Friedman, "Digital Systems Testing and Testable Design." Computer Science Press, 1990

[8] A. Smith, A. Veneris, M. F. Ali, and A. Viglas, "Fault diagnosis and logic debugging using Boolean satisfiability, " IEEE Trans. on CAD, vol. 24, no. 10, pp. 1606-1621, 2005

[9] M. F. Ali, S. Safarpour, A. Veneris, M. Abadir, and R. Drechsler, "Post-verification debugging of hierarchical designs", Int'l Conference on CAD, 2005, pp. 871-876

[10] E. Clarke, O. Grumberg, and D. Long, "Model checking and abstraction", in Symposium on Principles of Programming Languages, 1992, pp. 342.354

[11] E. Clarke, A. Gupta, and O. Strichman, "SAT-based counter-example guided abstraction refinement", IEEE Trans. on CAD, vol. 22, no. 7, pp. 1113.1123, 2004

[12] P. Bjesse and J. Kukula, "Using counter example guided abstraction refinement to find complex bugs", in Design, Automation and Test in Europe, 2004, pp. 156.161

[13] S. Safarpour, M. Liffiton, H. Mangassarian, A. Veneris, K. Sakailah, "Improved Design Debugging using Maximum Satisfiability", To appear in Formal Methods in Computer Aided Design (FMCAD), Austin, Tex., 2007

[14] T. Larrabee, "Test Pattern Generation Using Boolean Satisfiability," in IEEE Trans. on CAD, vol. 11, no. 1, pp. 4-15, Jan. 1992

What is claimed is:

1. A diagnosis method for enabling automated debugging of pre-fabricated hardware designs comprising the steps of:
  (a) selecting a first plurality of circuit design elements in a circuit design, the circuit design elements being expressed as RTL or gate level elements;
  (b) removing the first plurality of circuit design elements in the circuit design;
  (c) optionally removing a second plurality of circuit design elements in the circuit design that provide a direct or indirect driving signal to the first plurality of circuit design elements;
  (d) inserting a plurality of signals in place of each of the said circuit design elements of the circuit design, so as to generate a modified circuit design;
  (e) performing automated debugging on the modified circuit design with the inserted signals constrained to their simulation value; and
  analyzing the results of automated debugging so as to determine one or more error locations in the circuit design.

2. The diagnosis method of claim 1 wherein the method is repeated until the error locations are found.

3. A diagnosis method for enabling automated debugging of pre-fabricated hardware designs comprising the steps of:

(a) applying an automated debugger to diagnose a plurality of circuit design elements in a circuit design, expressed as RTL or gate level elements, so as to construct a diagnosis problem for the circuit design based on the circuit and the vectors for the circuit design;

(b) providing the diagnosis problem to one or more diagnosis tools, and initiating the diagnosis tools to iteratively analyze the diagnosis problem so as to obtain any error locations for the circuit design.

4. The diagnosis method of claim 3, wherein the automated debugger is operable to use one or more debugging techniques consisting of path-tracing, SAT/QBF solving, and/or symbolic simulation (BDDs).

\* \* \* \* \*